(12) United States Patent
Shaheen et al.

(10) Patent No.: US 7,042,009 B2
(45) Date of Patent: May 9, 2006

(54) HIGH MOBILITY TRI-GATE DEVICES AND METHODS OF FABRICATION

(75) Inventors: Mohamad A. Shaheen, Portland, OR (US); Brian Doyle, Portland, OR (US); Suman Dutta, Beaverton, OR (US); Robert S. Chau, Beaverton, OR (US); Peter Tolchinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,183

(22) Filed: Jun. 30, 2004

(65) Prior Publication Data

US 2006/0001109 A1  Jan. 5, 2006

(51) Int. Cl.
*H01L 27/01* (2006.01)
*H01L 29/04* (2006.01)

(52) U.S. Cl. .................... 257/64; 257/74; 257/255; 257/350; 257/627

(58) Field of Classification Search ............ 257/64, 257/74, 255, 347, 350, 351, 627
See application file for complete search history.

(56) References Cited

U.S. PATENT DOCUMENTS

| | | | |
|---|---|---|---|
| 5,124,777 A * | 6/1992 | Lee ............................ 257/532 |
| 5,346,839 A | 9/1994 | Sundaresan |
| 5,545,586 A | 8/1996 | Koh |
| 5,563,077 A | 10/1996 | Ha |
| 5,578,513 A | 11/1996 | Maegawa |
| 5,658,806 A | 8/1997 | Lin et al. |
| 5,701,016 A * | 12/1997 | Burroughes et al. .......... 257/24 |
| 5,716,879 A | 2/1998 | Choi et al. |
| 6,376,317 B1 | 4/2002 | Forbes et al. |
| 6,413,802 B1 | 7/2002 | Hu et al. |
| 6,475,869 B1 | 11/2002 | Yu |
| 6,483,156 B1 | 11/2002 | Adkisson et al. |
| 6,525,403 B1 | 2/2003 | Inaba et al. |
| 6,562,665 B1 | 5/2003 | Yu |
| 6,611,029 B1 | 8/2003 | Ahmed et al. |

(Continued)

FOREIGN PATENT DOCUMENTS

EP  0 623 963 A1  11/1994

(Continued)

OTHER PUBLICATIONS

PCT Int'l Search Report for Int'l. Application No. PCT/US2005/020339, Filing Date, Jun. 9, 2005, mailed Oct. 4, 2005. (6 pages).

(Continued)

*Primary Examiner*—T. N. Quach
(74) *Attorney, Agent, or Firm*—Blakely, Sokoloff, Taylor & Zafman LLP

(57) ABSTRACT

A high mobility semiconductor assembly. In one exemplary aspect, the high mobility semiconductor assembly includes a first substrate having a first reference orientation located at a <110> crystal plane location on the first substrate and a second substrate formed on top of the first substrate. The second substrate has a second reference orientation located at a <100> crystal plane location on the second substrate, wherein the first reference orientation is aligned with the second reference orientation. In another exemplary aspect, the second substrate has a second reference orientation located at a <110> crystal plane location on the second substrate, wherein the second substrate is formed over the first substrate with the second reference orientation being offset to the first reference orientation by about 45 degrees.

9 Claims, 16 Drawing Sheets

U.S. PATENT DOCUMENTS

| | | |
|---|---|---|
| 6,645,797 B1 | 11/2003 | Buynoski et al. |
| 6,680,240 B1 | 1/2004 | Maszara |
| 6,709,982 B1 | 3/2004 | Buynoski et al. |
| 6,716,684 B1 | 4/2004 | Krivokapic et al. |
| 6,730,964 B1 | 5/2004 | Horiuchi |
| 6,756,657 B1* | 6/2004 | Zhang et al. ............... 257/627 |
| 6,884,154 B1* | 4/2005 | Mizushima et al. .......... 451/44 |
| 2002/0011612 A1 | 1/2002 | Hieda |
| 2002/0036290 A1 | 3/2002 | Inaba et al. |
| 2002/0081794 A1 | 6/2002 | Ito |
| 2002/0167007 A1 | 11/2002 | Yamazaki et al. |
| 2003/0057485 A1 | 3/2003 | Gambino et al. |
| 2003/0085194 A1* | 5/2003 | Hopkins ........................ 216/2 |
| 2003/0102497 A1 | 6/2003 | Fried et al. |
| 2004/0119100 A1 | 6/2004 | Nowak et al. |
| 2004/0256647 A1 | 12/2004 | Lee et al. |
| 2005/0118790 A1* | 6/2005 | Lee et al. .................... 438/460 |
| 2005/0224797 A1* | 10/2005 | Ko et al. ....................... 257/64 |

FOREIGN PATENT DOCUMENTS

| | | |
|---|---|---|
| EP | 1 202 335 A2 | 5/2002 |
| EP | 1 566 844 A2 | 8/2005 |
| JP | 2003 298051 | 10/2003 |
| WO | WO 02/43151 A | 5/2002 |

OTHER PUBLICATIONS

T. Park, et al., Fabrication of Body-Tied FinFETs (Omega MOSFETs) Using Bulk Si Wafers. [This work was in part supported by Tera Level Nanodevices Project of MOST in 2002] (2 pages).

Chang, S.T, et al.: "3-D Simulation of Strained S/SiGe heterojunction FinFets", Semiconductor Device Research Symposium, 2003 International Dec. 10-12, 2003. Piscataway, NJ, USA, IEEE, Dec. 2003, pp. 176-177.

Burenkov, A, et al.: "Corner effect in Double and Triple Gate FinFETs", European Solid-State Device Research 2003, 33rd Conference on. ESSDERC ,Sep. 16, 2003 pp. 135-138.

PCT International Search Report for PCT Application No. PCT/US 2005/010505. Mailed on Aug. 8, 2005. (24 pages).

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deepsub-tenth Micron Era", 1998 IEEE International Electron Device Meeting Technical Digest, pp 1032-1034 (1998).

Huang et al., "Sub 50-nm FinFET: PMOS", 1999 IEEE International Electron Device Meeting Technical Digest, pp 67-70 (1999).

Auth et al., "Vertical, Fully-Depleted, Surroundings Gate MOSFETS On sub-0.1um Thick Silicon Pillars", 1996 54th Annual Device Research Conference Digest, pp 108-109 (1996).

Hisamoto et al., "A Fully Depleted Lean-Channel Transistor (DELTA)—A Novel Vertical Ultrathin SOI MOSFET", IEEE Electron Device Letters, V. 11(1), pp36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242.
International Search Report PCT/US 03/39727.
International Search Report PCT/US 03/40320.

* cited by examiner

<110> : <100> COMPARISON

Mobility along <100> and <110>
directions. <110> is significantly lower than <100>

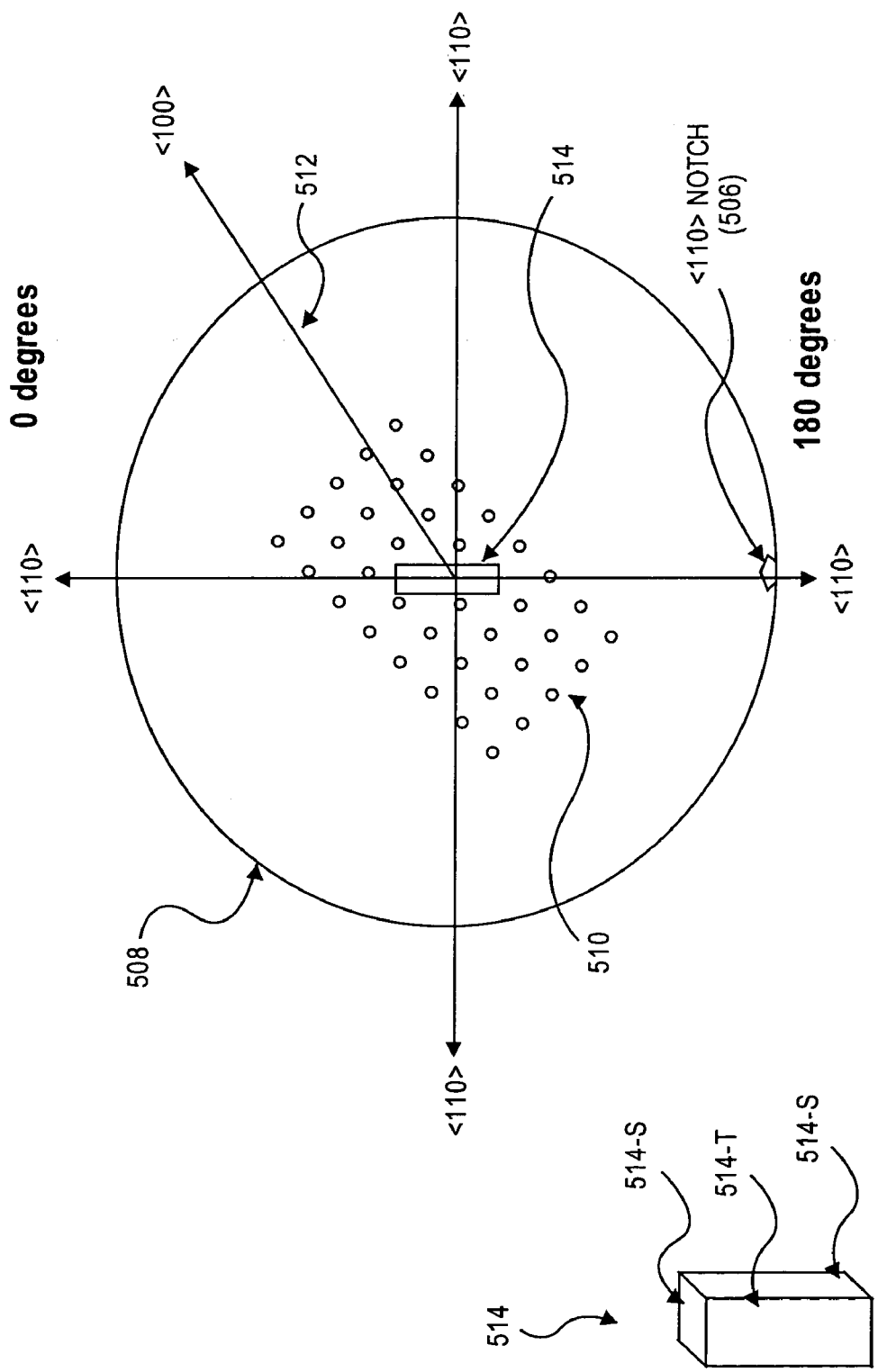

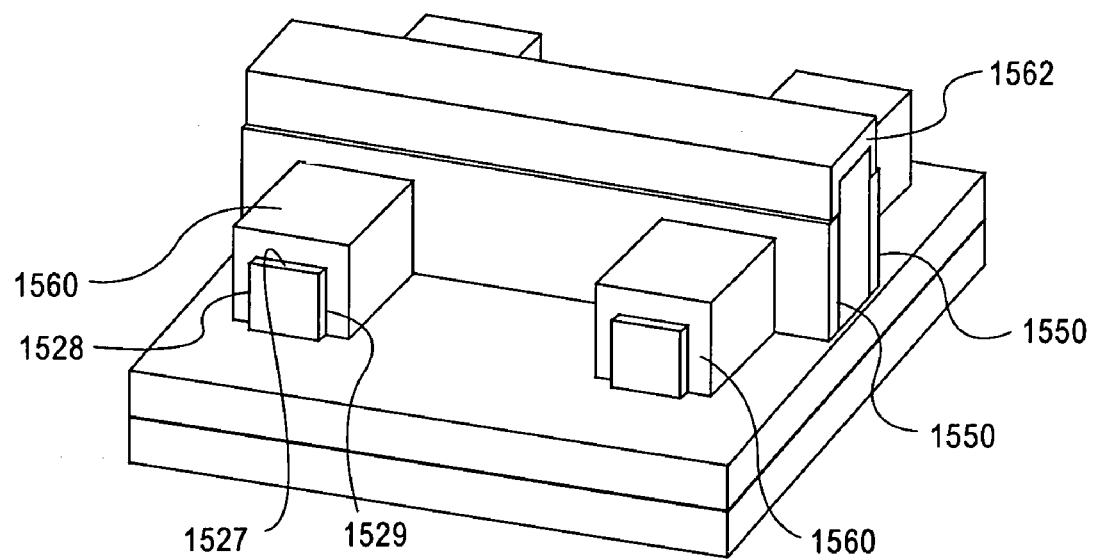
FIG. 15H
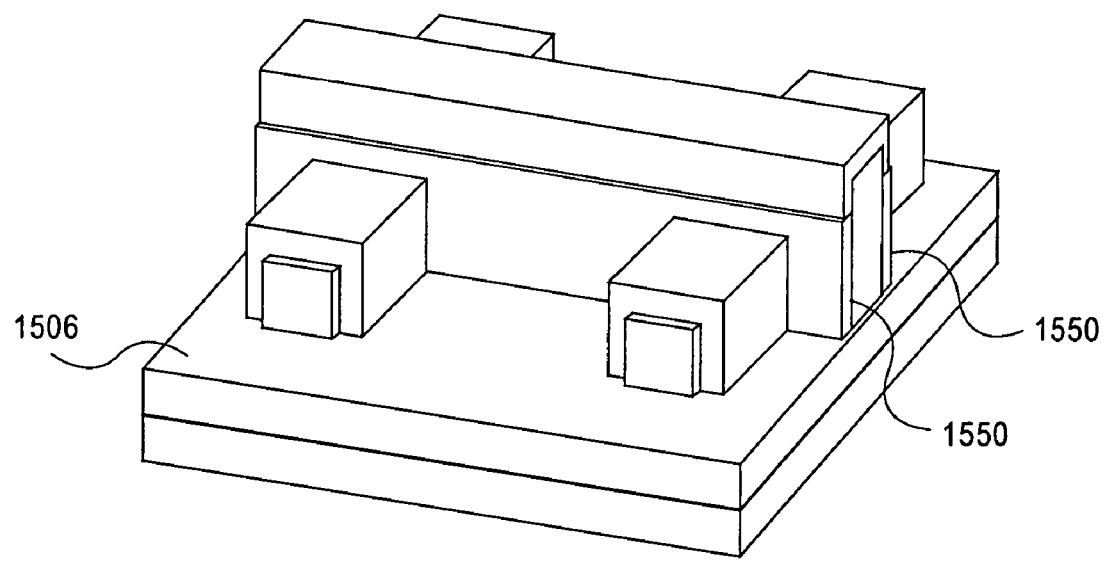
FIG. 15I

US 7,042,009 B2

HIGH MOBILITY TRI-GATE DEVICES AND METHODS OF FABRICATION

FIELD

The present invention relates to the field of semiconductor integrated circuit manufacturing, and more particularly to a high mobility tri-gate device such as a high mobility tri-gate transistor and their methods of fabrication.

DISCUSSION OF RELATED ART

In order to increase device performance, silicon on insulator (SOI) transistors have been proposed for the fabrication of modern integrated circuits. FIG. 1 illustrates a standard fully depleted silicon on insulator (SOI) transistor 100. The SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 is formed on the gate dielectric 108. Source 112 and drain 114 regions are formed in the silicon body 106 along laterally opposite sides of the gate electrode 110.

Fully depleted SOI have been proposed as a transistor structure to take advantage of ideal sub-threshold gradients for optimized on current/off current ratios. In order to achieve ideal subthreshold gradients with the transistor 100, the thickness (Tsi) of the silicon body 106 must be about ⅓ the size of the gate length (Lg) of the transistor or Tsi=Lg/3. However, as gate lengths scale, especially as they approach 30 nm, the need for ever decreasing silicon film thickness makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202.

Double gate (DG) device 200 essentially has two gates, one on either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where Tsi=(2×Lg)/3. The most manufacturable form of the double gate (DG) device 200, however, requires that the body 202 patterning be done with photolithography that is 0.7× smaller than that used to pattern the gate length (Lg) of the planar device (e.g., the transistor 100). In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, the silicon body 202 requires a silicon body etch which can produce a silicon body 202 with an aspect ratio (height to width) of about 5:1. Additionally, with demand for high device performance continue to increase, devices with high mobility to increase device performance are desirable.

BRIEF DESCRIPTION OF THE DRAWINGS

FIGS. 7A–7B illustrate a wafer sliced from the silicon ingot shown in FIG. 5 with a device formed thereon.

FIGS. 15A–15J illustrate an exemplary method of making a tri-gate transistor in accordance to an embodiment of the present invention.

DETAILED DESCRIPTION

Embodiments of the present invention pertain to a novel high mobility non-planar device or a tri-gate device such as a tri-gate transistor structure and methods of fabricating the same. In the following description numerous specific details are set forth in order to provide a thorough understanding in the embodiments of the present invention. In other instances, well-known semiconductor process and manufacturing techniques have not been described in particular detail in order to not unnecessarily obscure the embodiments of the present invention.

Figure 1:
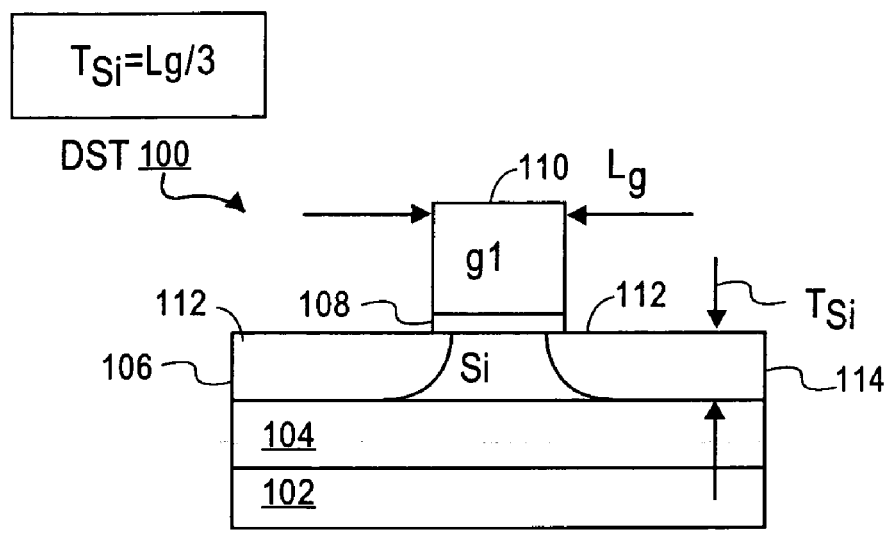
FIG. 1 is an illustration of a cross-sectional view of a depleted substrate transistor.
Figure 2A:
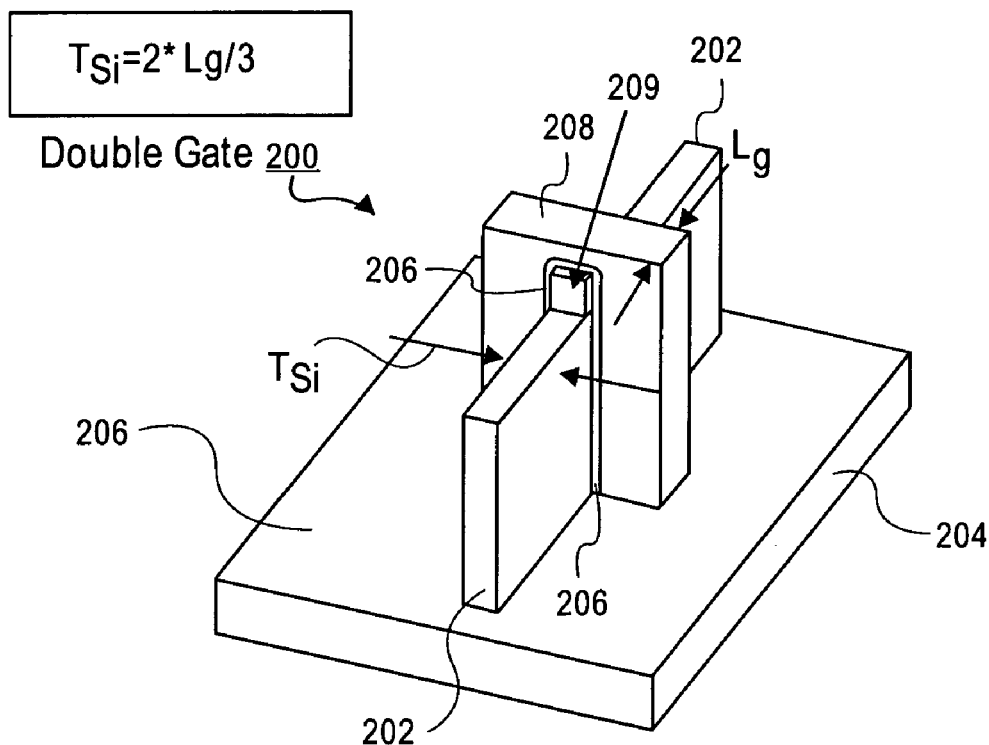
FIG. 2A and FIG. 2B illustrate a double gate depleted substrate transistor.
Figure 2B:
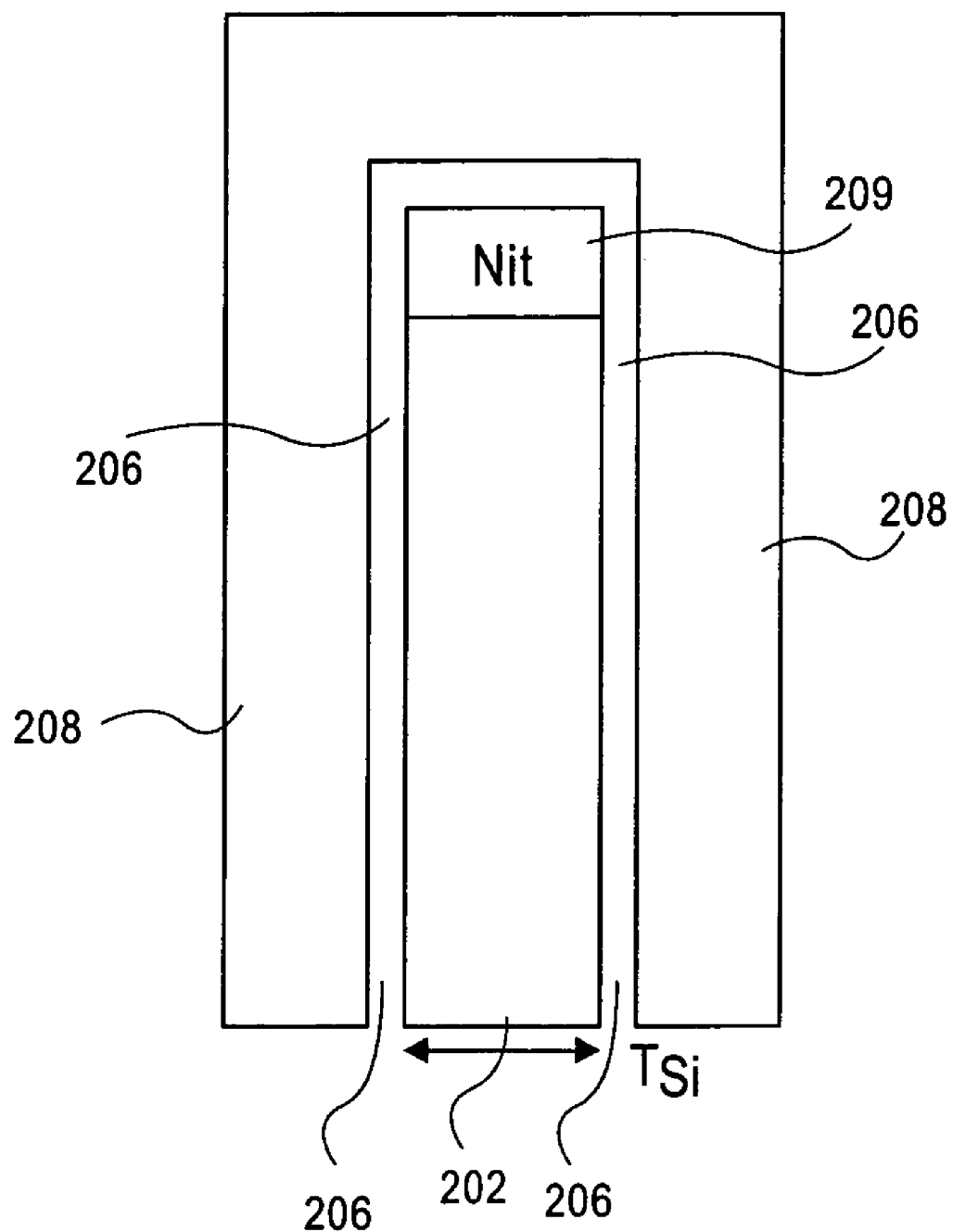
Figure 3:
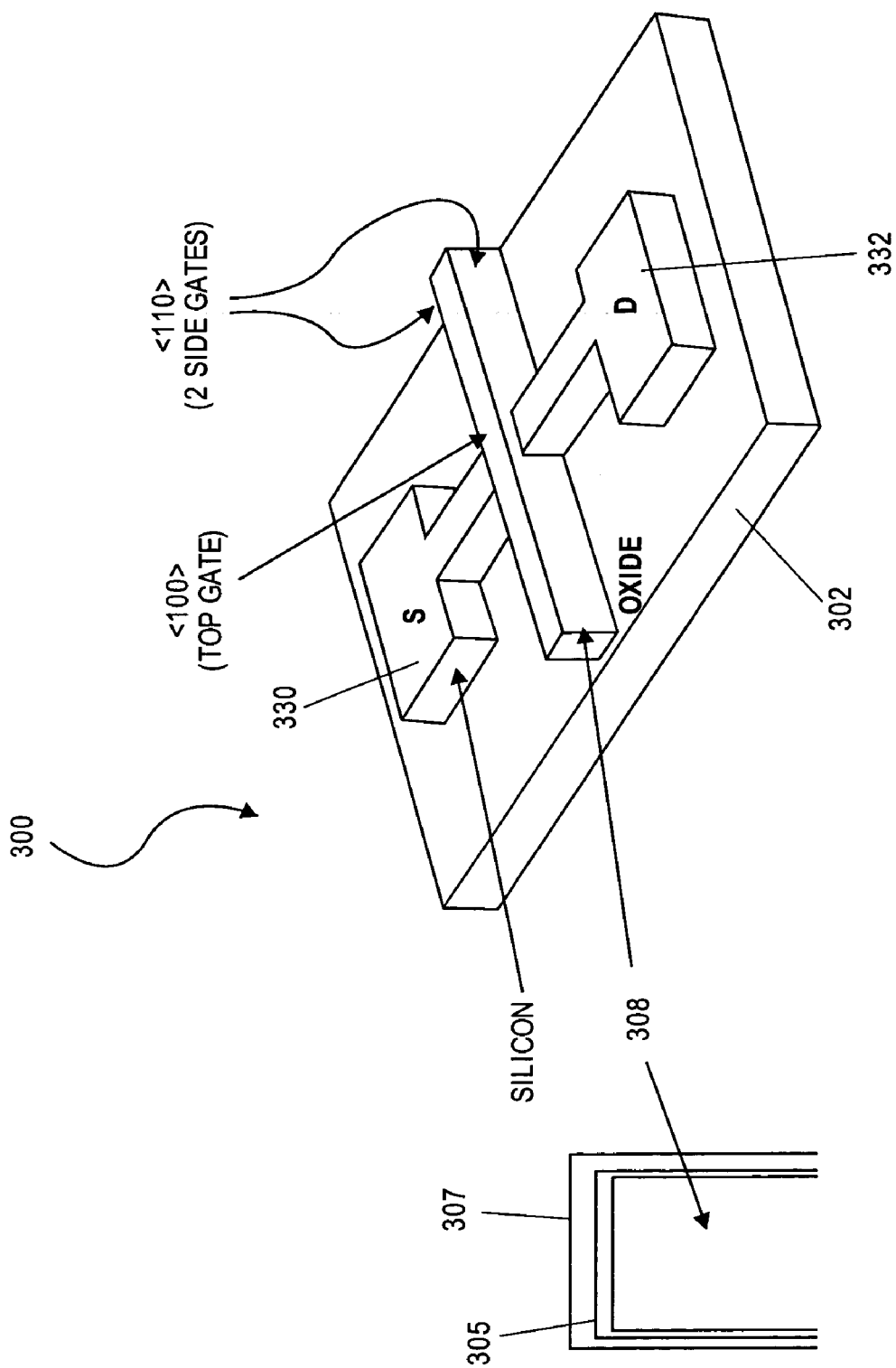
FIG. 3 is an illustration of a tri-gate transistor in accordance with an embodiment of the present invention.

Embodiments of the present invention pertain to a high mobility non-planar device (e.g., a tri-gate transistor). The high mobility characteristic of the non-planar device is achieved by rotation or relocation of a reference orientation of a substrate wafer that is used to form the high mobility non-planar device. FIG. 3 illustrates an exemplary non-planar device 300 (e.g., a tri-gate transistor).

In an embodiment of the present invention, the tri-gate transistor 300 is a semiconductor on insulator (SOI) transistor. The tri-gate transistor 300 includes a thin semiconductor body 308 formed on a substrate 302; the substrate 302 can be an insulating substrate (e.g., the substrate 302 including an oxide film) or a semiconductor substrate. The semiconductor body 308 includes a gate dielectric 305 which is formed on the top surface and the sidewalls of the semiconductor body 308, and a gate electrode 307 which is formed on the gate dielectric 305 on the top surface of the semiconductor body 308 and is formed adjacent to the gate dielectric 307 formed on the sidewalls of the semiconductor body 308. Source and drain regions 330 and 332, respectively, are formed in the semiconductor body 308 on opposite sides of the gate electrode 307. Because the gate electrode 307 and the gate dielectric 305 surround the semiconductor body 308 on three sides, the transistor 300 essentially has three separate channels and gates. The gate "width" of a transistor is equal to the sum of each of the three sides of the semiconductor body.

Because there are three separate channels formed in the semiconductor body, the semiconductor body can be fully depleted when the transistor is turned "ON", thereby enabling the formation of a fully depleted transistor with gate lengths of less than 30 nanometers without requiring the use of ultra-thin semiconductor bodies or requiring photolithographic patterning of the semiconductor bodies to dimensions less than the gate length (Lg) of the device. Because the tri-gate transistor of the present invention can be operated in a fully depleted manner, the device is characterized by ideal (e.g., very sharp) subthreshold slope and a reduced drain induced barrier lowering (DIBL) short channel effect of less than 100 mV/V and ideally about 60 mV/V which results in a lower leakage current when the device is turned "OFF" resulting in lower power consumption.

Figure 4:
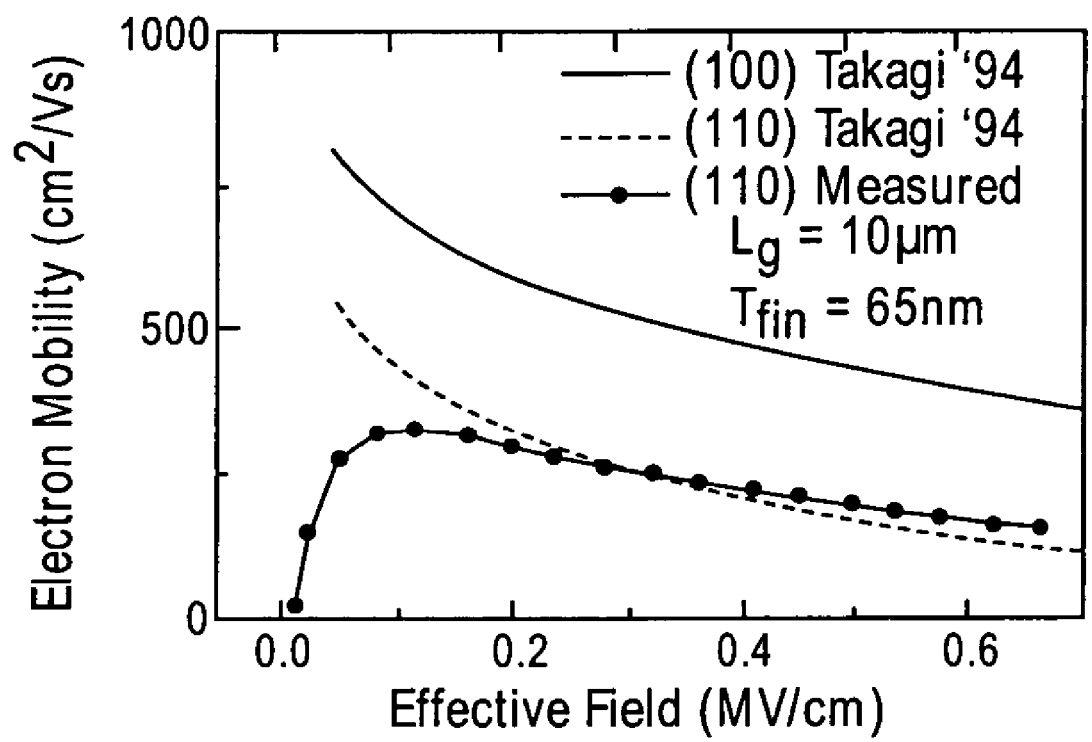
FIG. 4 is an illustrative comparison of <100> and <110> mobility characteristics.

It is desirable to have non-planar devices such as the tri-gate transistor 300 being high mobility devices for improved device performance. In the embodiments of the present invention, in order to improve the mobility of the non-planar device 300, the crystal plane structure of the semiconductor body 308 is altered. As shown in FIG. 3, the non-planar device 300 has a vertical field on the top surface of the semiconductor body 308 that has a <100> crystal plane. The vertical field for the sides of semiconductor body 308 has a <110> crystal plane. It has been shown that there is a significant difference between the <100> and the <110> crystal planes in term of mobility. The <110> crystal plane has a mobility value that is about half of the <100> crystal plane as shown in FIG. 4. As shown in FIG. 4, the Takagi line for the <100> crystal plane is significantly higher than the Takagi line for the <110> crystal plane. One way to improve the mobility of the non-planar device is to have the vertical fields for all sides of the semiconductor body 308 have the <100> crystal plane.

Most often, the substrate 302 is made of a semiconductor wafer, which is then processed where films and structures are formed therein to form semiconductor devices such as the tri-gate device 300. In one instance, the substrate 302 is a bulk silicon wafer. An insulation layer (e.g., a silicon dioxide film) is formed over the substrate 302, and a device quality semiconductor film (e.g., a monocrystalline silicon) is formed over the insulation layer. The device 300 is then formed in the device quality semiconductor film. It is a practice in the semiconductor fabrication field to create a reference orientation on a wafer or wafers that are used to form devices. The reference orientation is typically a small notch created in the wafer. The reference orientation is useful for equipments (e.g., etching tool or lithography tool) alignment purpose and especially for fabrication repeatability (e.g., device processes such as lithography and etching). The processing tools thus have an alignment point where each notch on a particular wafer is aligned for processing. As is known, silicon or other semiconductor material has different crystal cubic orientation at different planes of the wafer. Thus, for repeatability of the crystal orientation, the reference orientation is created to mark a uniform direction for the wafer. The reference orientation also provides repeatability of processes from wafer to wafer.

Figure 5:
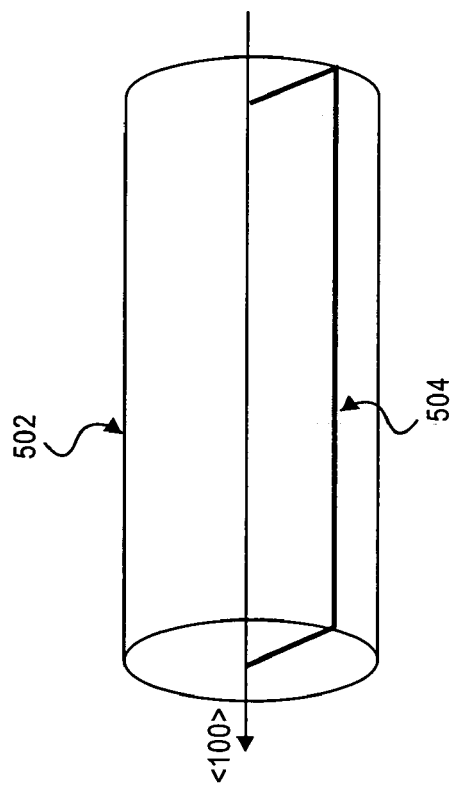
FIG. 5 is an illustration of a silicon ingot grown in a <100> crystal plane direction and having a reference orientation at a <110> crystal plane location.
Figure 6:
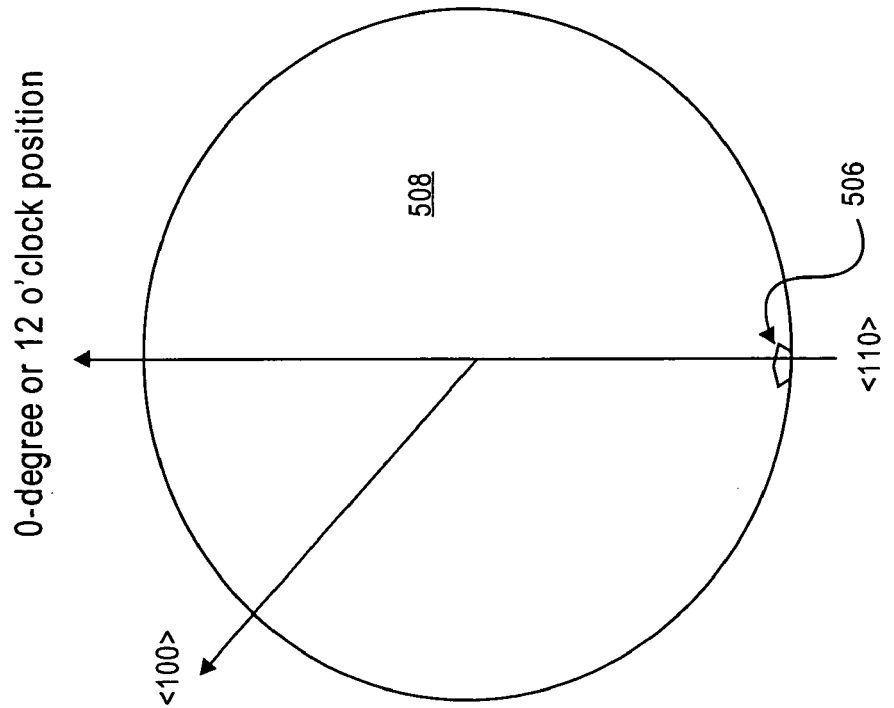
FIG. 6 is an illustration of a wafer sliced from the silicon ingot shown in FIG. 5.

One way to create the reference orientation in a wafer is to make a notch at a particular position on the wafer. Currently, an ingot, e.g., a silicon ingot, is grown with seed in the direction of the <100> crystal plane. As illustrated in FIG. 5, the ingot 502 is grown in the <100> crystal plane direction. The ingot 502 is the placed in an X-Ray-Diffraction tool to allow one to find the <110> plane direction. During the X-Ray-Diffraction process, the ingot 502 is rotated radially so that the X-Ray-Diffraction beam can visualize and locate the <110> location. Once the <110> location is found, the ingot 502 is marked along the line 504 so that the notch 506 can be formed in each wafer as shown in FIG. 6. Grinding may be used to create the line 504. Slicing is then used to slice the ingot 502 to create a plurality of wafer 508. As illustrated in FIG. 6, the wafer 508 has a <100> crystal plane in the direction point out of the page. The notch 506 has a <110> crystal plane and is located at the 180-degree or 6 o'clock position of the wafer 508.

FIG. 7A illustrates further the crystal structure properties of the wafer 508. Circles 510 represent the crystal plane of the crystal structure of the wafer 508 with respect to the plane of the page. As illustrated, the <100> crystal plane is the surface of the wafer 508 and as such in the direction of the arrow 512 pointing out of the page. When a non-planar device 514 is formed in the wafer 508, the sides 514-S of the non-planar device 514 will have the <110> crystal planes as illustrated in FIG. 7A. The top side 514-T of the device 514 has the <100> crystal plane. One way to alter the crystal plane structures of the sides of the device 514 formed in the wafer 508 is to rotate or relocate the notch 506. In one embodiment of the present invention, instead of having the notch 506 located at the <110> crystal plane location as conventionally done, the notch 506 is located at a <100> crystal plane location on the wafer 508. In another embodiment, the notch 506 can be marked at the <110> location as conventionally done and the wafer 508 is rotated about 45 degrees (or −45 degrees) in the fabrication tool so that the crystal planes as illustrated by the circles 510 are rotated by about 45 degrees (or −45 degrees).

Figure 8A:
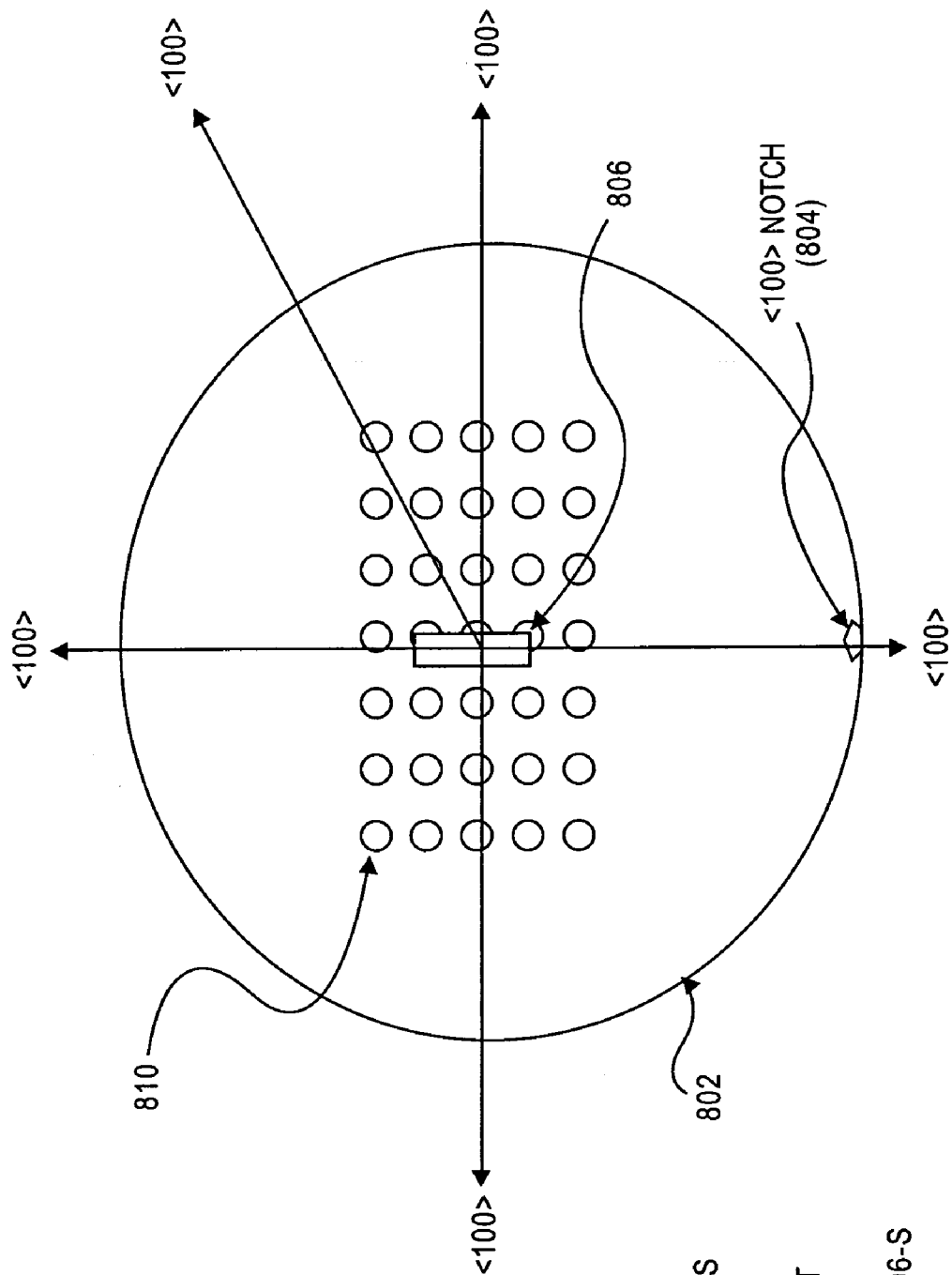
FIGS. 8A–8B illustrate a wafer with a reference notch formed at a <100> crystal plane location.
Figure 8B:
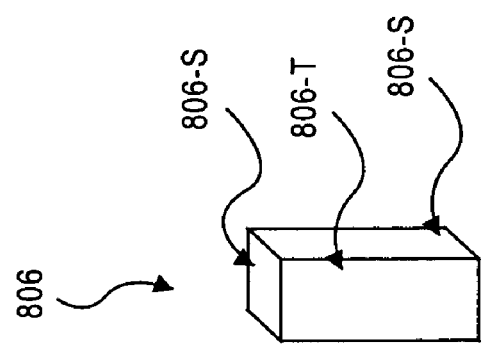

FIG. 8A illustrates a wafer 802 having a notch 804 at a <100> crystal plane location. The circles 810 shown in the wafer 802 indicate the crystal plane of the crystal structure of the wafer 802 with respect to the plane of the page. Pointing out of the page, the crystal plane of the wafer 802 is <100>. When a non-planar device 806 is formed in the wafer 802, all sides of the devices 806 have a <100> crystal plane. Thus, the top surface 806-T of the device 806 has a <100> crystal plane and all sides 806-S of the devices 806 also have a <100> crystal plane.

Alternatively, when the wafer has the notch at the <110> location, during processing, the wafer can be rotated by 45 degrees (or 45 degrees). In doing so, when a non-planar device is formed on the wafer, all sides of the devices also have a <100> crystal plane.

With all sides of the non-planar device having the <100> crystal planes, the non-planar device will have the high mobility characteristic that is desirable for high performance devices.

Figure 9:
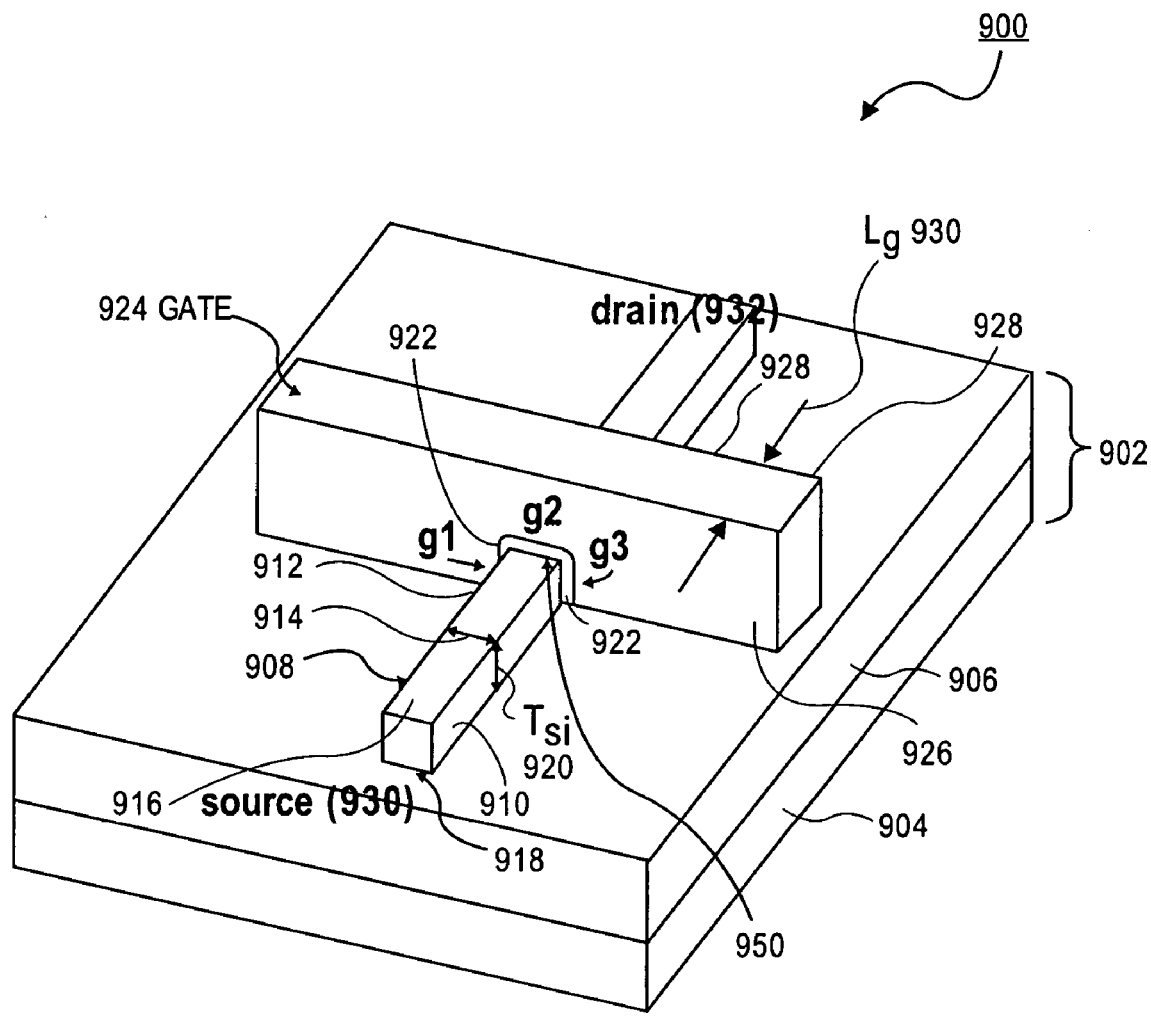
FIG. 9 is an illustration of a tri-gate transistor in accordance with an embodiment of the present invention.

FIG. 9 illustrates an exemplary non-planar device such as a tri-gate device (e.g., a tri-gate transistor 900) that can benefit from the high mobility characteristic of the device by having the notch of the wafer relocated or rotated. The non-planar device is thus a high mobility non-planar device, which can be a high mobility tri-gate transistor.

The tri-gate transistor 900 is formed on a substrate 902. In an embodiment of the present invention, the substrate 902 is an insulating substrate which includes a lower monocrystalline silicon substrate 904 upon which is formed an insulating layer 906, such as a silicon dioxide film. The tri-gate transistor 900, however, can be formed on any well-known insulating substrate such as substrates formed from silicon dioxide, nitrides, oxides, and sapphires. In an embodiment of the present invention, the substrate 902 can be a semiconductor substrate, such as but not limited to monocrystalline silicon substrate and gallium arsenide substrate.

The tri-gate transistor 900 includes a semiconductor body 908 formed on the insulating layer 906 of the insulating substrate 902. The semiconductor body 908 can be formed from a semiconductor film. With the semiconductor film on the insulating substrate 902, the tri-gate transistor 900 can be thought of as an SOI transistor. The semiconductor body 908 can be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. The semiconductor body 908 is ideally a single crystalline film when the best electrical performance of the transistor 900 is desired such as in microprocessors. The semiconductor body 908, however, can be a polycrystalline film when the transistor 900 is used in applications requiring less stringent performance, such as in liquid crystal displays. The wafer used to form the semiconductor body 908 is processed so that all sides of the semiconductor body 908 will have a <100> crystal planes as previously described.

In one embodiment, the semiconductor material used to form the semiconductor body 908 is a wafer (e.g., a silicon wafer) processed or formed with a reference notch located at a <100> crystal plane location on the wafer. In another embodiment, the semiconductor material used to form the semiconductor body 808 is a wafer (e.g., a silicon wafer) processed or formed with a reference notch located at a <110> crystal plane location on the wafer. In this another embodiment, the wafer used to form the semiconductor body 908 is rotated so that the reference notch is offset by about 45 degrees or by −45 degrees.

The semiconductor body 908 has a pair of laterally opposite sidewalls 910 and 912 separated by a distance, which defines a semiconductor body width 914. Additionally, the semiconductor body 908 has a top surface 916 opposite a bottom surface 918 formed on the substrate 902. The distance between the top surface 916 and the bottom surface 918 defines a body height 920 or the thickness Tsi of the semiconductor body 908. In an embodiment of the present invention the body height 920 is substantially equal to the body width 914. In an embodiment of the present invention, the body 908 has a width 914 and height 920 less than 30 nanometers and ideally less than 20 nanometers. In an embodiment of the present invention, the body height 920 is between ½ the body width 914 to 2 times the body width 914. The side walls 910 and 912, the top surface 916, and the bottom surface 918 all have a vertical field having the <100> crystal plane structure.

The tri-gate transistor 900 has a gate dielectric layer 922. The gate dielectric layer 922 is formed on and around three sides of the semiconductor body 908 as shown in FIG. 9. The gate dielectric layer 922 is formed on or adjacent to the sidewall 912, on the top surface 916, and on or adjacent to the sidewall 910 of the body 908 as shown in FIG. 9. The gate dielectric layer 922 can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 922 is a silicon oxynitride film formed to a thickness of between 5–20 Å. In an embodiment of the present invention, the gate dielectric layer 922 is a high K gate dielectric layer, such as a metal oxide dielectric, such as but not limited to tantalum pentaoxide ($Ta_2O_5$), and titantium oxide ($TiO_2$). The gate dielectric layer 922 can be other types of high K dielectric, such as but not limited to PZT (lead zirconate titanate).

The tri-gate device 900 has a gate electrode 924. The gate electrode 924 is formed on and around the gate dielectric layer 922 as shown in FIG. 9. The gate electrode 924 is formed on or adjacent to the gate dielectric 922 formed on the sidewall 912 of the semiconductor body 908, is formed on the gate dielectric 922 formed on the top the surface 916 of the semiconductor body 908, and is formed adjacent to or on the gate dielectric layer 922 formed on the sidewall 910 of the semiconductor body 908. The gate electrode 924 has a pair of laterally opposite sidewalls 926 and 928 separated by a distance which defines the gate length (Lg) 930 of the transistor 900. In an embodiment of the present invention the laterally opposite sidewalls 926 and 928 of the gate electrode 924 run in a direction perpendicular to the laterally opposite sidewalls 910 and 912 of the semiconductor body 908.

The gate electrode 924 can be formed of any suitable gate electrode material. In an embodiment of the present invention the gate electrode 924 comprises of polycrystalline silicon doped to a concentration density between $1 \times 10^{19}$ atoms/cm$^3$–$1 \times 10^{20}$ atoms/cm$^3$. In an embodiment of the present invention the gate electrode can be a metal gate electrode, such as but not limited to, tungsten, tantalum, titanium, and their nitrides. In an embodiment of the present invention the gate electrode is formed from a material having a mid-gap work function between 4.6–4.8 eV. It is to be appreciated, the gate electrode 924 need not necessarily be a single material and can be a composite stack of thin films, such as but not limited to a polycrystalline silicon/metal electrode or a metal/polycrystalline silicon electrode.

The tri-gate transistor 900 has a source region 930 and a drain region 932. The source region 930 and drain region 932 are formed in semiconductor body 908 on opposite sides of gate electrode 924 as shown in FIG. 9. The source region 930 and the drain region 932 are formed of the same conductivity type such as N-type or P-type conductivity. In an embodiment of the present invention the source region 930 and the drain region 932 have a doping concentration of between $1 \times 10^{19}$, and $1 \times 10^{21}$ atoms/cm$^3$. The source region 930 and the drain region 932 can be formed of uniform concentration or can include sub-regions of different concentrations or doping profiles such as tip regions (e.g., source/drain extensions). In an embodiment of the present invention when the transistor 900 is a symmetrical transistor, the source region 930 and the drain region 932 will have the same doping concentration and profile. In an embodiment of the present invention when the tri-gate transistor 900 is formed as an asymmetric transistor then the doping concentration and profile of the source region 930 and the drain region 932 may vary in order to obtain a particular electrical characteristic.

The portion of semiconductor body 908 located between the source region 930 and the drain region 932, defines the channel region 950 of the transistor 900. The channel region 950 can also be defined as the area of the semiconductor body 908 surrounded by the gate electrode 924. At times however, the source/drain region may extend slightly beneath the gate electrode through, for example, diffusion to define a channel region slightly smaller than the gate electrode length (Lg). In an embodiment of the present invention, the channel region 950 is intrinsic or undoped monocrystalline silicon. In an embodiment of the present invention, the channel region 950 is doped monocrystalline silicon. When channel region 950 is doped, it is typically doped to a conductivity level of between $1 \times 10^{16}$ to $1 \times 10^{19}$ atoms/cm$^3$. In an embodiment of the present invention, when the channel region 950 is doped it is typically doped to the opposite conductivity type of the source region 930 and the drain region 932. For example, when the source and drain regions are N-type conductivity the channel region 950 would be doped to p type conductivity. Similarly, when the source and drain regions are P type conductivity the channel region 950 would be N-type conductivity. In this manner the tri-gate transistor 900 can be formed into either a NMOS transistor or a PMOS transistor respectively. The channel region 950 can be uniformly doped or can be doped non-uniformly or with differing concentrations to provide particular electrical and performance characteristics. For example, the channel regions 950 can include well-known "halo" regions, if desired.

By providing a gate dielectric and a gate electrode which surrounds the semiconductor body 908 on three sides, the tri-gate transistor 900 is characterized in having three channels and three gates, one (g1) which extends between the source and drain regions on side 912 of silicon body 908, a second (g2) which extends between the source and drain regions on the top surface 916 of silicon body 908, and the third (g3) which extends between the source and drain regions on the sidewall 910 of silicon body 908. Each of the gate g1, g2, and g3 has a <100> crystal plane structure due to the construction of the semiconductor body 908 as previously discussed. The mobility is thus improved with three <100> crystal plane gates making the transistor 900 a high mobility non-planar device. The gate "width" (Gw) of transistor 900 is the sum of the widths of the three channel regions. Thus, the gate width of the transistor 900 is equal to the height 920 of the silicon body 908 at the sidewall 910, plus the width of the silicon body of 908 at the top surface 916, plus the height 920 of the silicon body 908 at the sidewall 912. Larger "width" transistors can be obtained by using multiple devices coupled together (e.g., multiple silicon bodies 908 surrounded by a single gate electrode 924).

Because the channel region 950 is surrounded on three sides by the gate electrode 924 and the gate dielectric 922, the transistor 900 can be operated in a fully depleted manner. When the transistor 900 is turned "on," the channel region 950 fully depletes thereby providing the advantageous electrical characteristics and performance of a fully depleted transistor. Additionally, when the transistor 900 is turned "ON" a depletion region is formed and a channel region 950 along with an inversion layer at the surfaces of the channel region 950 (e.g., an inversion layer is formed on the side surfaces and the top surface of the semiconductor body 908). The inversion layer has the same conductivity type as the source and drain regions and forms a conductive channels between the source and drain regions to allow current to flow there between. The tri-gate transistor 900 is a nonplanar transistor because the channel regions are formed in both the horizontal and vertical directions in the semiconductor body 908. The depletion region depletes free carriers from beneath the inversion layers. The depletion region extends to the bottom of the channel region 950, thus the transistor can be said to be a "fully depleted" transistor. Fully depleted transistors have improved electrical performance characteristics over non-fully depleted or partially depleted transistors. For example, by operating the transistor 900 in the fully depleted manner, the transistor 900 has an ideal or very steep subthreshold slope. The tri-gate transistor can be fabricated with very steep sub-threshold slope of less than 80 mV/decade, and ideally about 60 mV/decade even when fabricated with semiconductor body thicknesses of less than 30 nm. Additionally, with the transistor 900 being fully depleted, the transistor 900 has an improved drain induced barrier (DIBL) low in effect which provides for better "OFF" state leakage which results in lower leakage and thereby lower power consumption. In an embodiment of the present invention the tri-gate transistor 900 has a DIBL effect of less than 100 mV/V and ideally less than 40 mV/V.

Because the transistor 900 has gates with high mobility characteristic due to the <100> crystal plane, the electrical characteristic of the transistor 900 is even better than devices with only the top surface having the <100> crystal planes.

Figure 10:
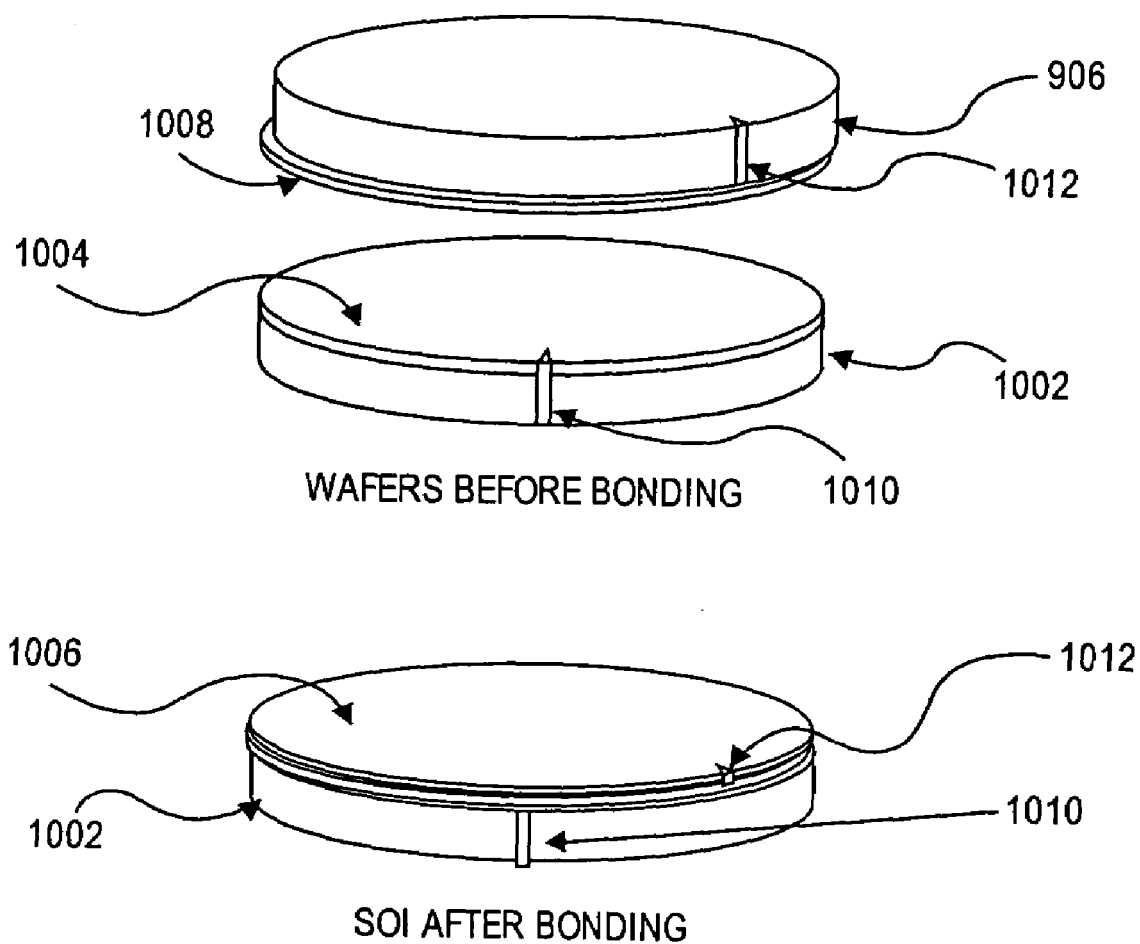
FIG. 10 is an illustration of a method of forming a high mobility silicon substrate for a tri-gate device in accordance to an embodiment of the present invention.

FIG. 10 illustrates an exemplary method of fabricating a substrate for a non-planar device such as the tri-gate transistor 900 in accordance with embodiments of the present invention. In one embodiment, a substrate 1002 is the first provided. The substrate 1002 can be a semiconductor substrate such as but not limited to a bulk silicon substrate, a monocrystalline silicon substrate, a lower monocrystalline silicon substrate, a polysilicon substrate, or a gallium arsernide substrate or other suitable semiconductor material. In one embodiment, the substrate 1002 includes an insulating layer 1004 such as a silicon dioxide film, a silicon nitride film, or other suitable dielectric films. The insulating layer 1004 may have a thickness between about 200–2000 angstroms.

A semiconductor device substrate 1006 is bonded to the substrate 1002. In the embodiment where the substrate 1002 includes the insulating layer 1004, the device substrate 1006 is bonded to the substrate 1002 at the insulating layer 1004. The semiconductor device substrate 1006 is the substrate with which a semiconductor body or bodies of the tri-gate transistor are fabricated. In one embodiment, the semiconductor device substrate 1006 is of a high quality silicon. In other embodiments, the semiconductor device substrate 1006 can be other types of semiconductor films such as but not limited to germanium (Ge), silicon germanium alloy (SiGe), gallium arsenide (GaAs), indium antimony (InSb), gallium phosphide (GaP), gallium antimony (GaSb), as well as carbon nanotubes.

In an embodiment of the present invention, the semiconductor device substrate 1006 is an intrinsic (undoped) silicon film. In other embodiments, the semiconductor device substrate 1006 is doped to a p type or n type conductivity with a concentration level between $1 \times 10^{16}$–$1 \times 10^{19}$ atoms/cm$^3$. The semiconductor device substrate 1006 can be insitu doped (e.g., doped while it is deposited) or doped after it is formed on the substrate 1002 by for example ion-implantation. Doping after formation enables both PMOS and NMOS tri-gate devices to be fabricated can be easily done on the same insulating substrate. The doping level of the semiconductor body at this point determines the doping level of the channel region of the non-planar device. In one embodiment, the semiconductor device substrate 1006 includes an insulating layer 1008 which can be a silicon dioxide film or a silicon nitride film, or other suitable dielectric film. The insulating layer 1008 may have a thickness between about 200 angstrom to about 2000 angstroms.

The semiconductor device substrate 1006 has a thickness which is approximately equal to the height desired for the subsequently formed semiconductor body or bodies of the fabricated tri-gate transistor. In an embodiment of the present invention, the semiconductor device substrate 1006 has a thickness or height 1016 of less than 30 nanometers and ideally less than 20 nanometers. In an embodiment of the present invention, the semiconductor device substrate 1006 has a thickness 1016 approximately equal to the gate "length" desired of the fabricated tri-gate transistor. In an embodiment of the present invention, the semiconductor device substrate 1006 has a thickness 1016 that is thicker than the desired gate length of the tri-gate transistor to be formed. In an embodiment of the present invention, the semiconductor device substrate 1006 has a thickness 1016 that will enable the fabricated tri-gate transistor to be operated in a fully depleted manner for its designed gate length (Lg). After the device substrate 1006 is bonded to or formed on the substrate 1002, an SOI substrate is formed. The semiconductor body for a tri-gate device is formed in the device substrate 1006. The device substrate 1006 is bonded to the substrate 1002 such that the tri-gate device formed in the device substrate 1006 will have <100> crystal plane in all sides.

The semiconductor device substrate 1006 can be formed on (or bonded to) the insulating substrate 1002 using any well-known method. In one exemplary method, the substrate 1002 includes a notch 1010 located at a <110> crystal plane location. The substrate 1002 can be a wafer sliced from an ingot that has a reference notch created at the <110> location as previously described. In one embodiment, the device substrate 1006 includes a notch 1012, also located at a <110> crystal plane location. Similar to the substrate 1002, the device substrate 1006 can be a wafer sliced from an ingot that has a reference notch created at the <110> crystal plane location. The device substrate 1006 may be of a higher quality than the substrate 1006. In one embodiment, the substrate 1002 includes an insulating layer 1004 and the device substrate 1006 includes an insulating layer 1008. The device substrate 1006 and the substrate 1002 are bonded together at the insulating layers using methods such as SMARTCUT or Bonded and Etch Back SOI (BESOI), or other bonding method. Before being bonded together, the device substrate 1006 is rotated so that the notch 1012 is offset by 45 degrees or –45 degrees with respect to the notch 1010. The crystal plane structure of the device substrate 1006 is thus altered.

In the SMARTCUT method, (FIG. 11), the device substrate 1006 may be oxidized to create the insulating layer 1008. The substrate 1002 may also be oxidized to create the insulating layer 1004. Ion implantation is then used implant ions to a predetermined depth in the device substrate 106 to induce formation of an in-depth weakened layer in the device substrate 1006. The substrates 1002 and 1006 are then cleaned and bonded to each other at the insulating layers 1004 and 1008. Prior to bonding, the substrate 1002 and the device substrate 1006 are offset with each other by about 45-degrees (or –45 degrees). In one embodiment, the substrates 1002 and 1006 are aligned over each other so that the notch 1012 of the substrate 1006 and the notch 1010 of the substrate 1002 are offset by 45 degrees to each other. In more particular, the substrate 1006, when bonded to the substrate 1002 has the notch 1012 rotated 45 degrees or –45 degrees with respect to the notch 1010 of the substrate 1002 (see FIG. 10). The offset of the notches 1012 to the notch 1010 will provide the tri-gate with a <100> crystal planes in all sides of the gate as previously discussed. Cleavage is then used to cleave a portion of the device substrate 1006 at the depth of the ion implantation. The remaining portion of the device substrate 1006 including the insulating layer 1008 is transferred (via bonding) to the substrate 1002. Annealing and polishing (e.g., chemical mechanical polishing (CMP)) may be used to complete the formation of an SOI substrate. The substrate 1002 and the device substrate 1006 having the oxides layers 1004 and 1008 sandwiched there between is referred to as the SOI substrate. The tri-gate device having <100> crystal plane structure on all sides will be formed on the device substrate 1006 surface.

In the BESOI method, (FIG. 12), the device substrate 1006 may be oxidized to create the insulating layer 1008. The substrate 1002 may also be oxidized to create the insulating layer 1004. The substrates 1002 and 1006 are cleaned and bonded to each other at the insulating layers 1004 and 1008. Prior to bonding, the substrate 1002 and the device substrate 1006 are offset with each other by about 45 degrees (or –45 degrees). In one embodiment, the substrates 1002 and 1006 are aligned over each other so that the notch 1012 of the substrate 1006 and the notch 1010 of the substrate 1002 are offset by 45 degrees to each other. In more particular, the substrate 1006, when bonded to the substrate 1002 has the notch 1012 rotated 45 degrees or –45 degrees with respect to the notch 1010 of the substrate 1002 (see FIG. 10). The offset of the notches 1012 to the notch 1010 will provide the tri-gate with a <100> crystal planes in all sides of the gate as previously discussed. After the bonding, the substrate 1006 is etched and polished (FIG. 11) to obtain the desired thickness. Annealing and polishing (e.g., CMP) may be used to complete the formation of the SOI substrate. The tri-gate device having <100> crystal plane structure on all sides will be formed on the device substrate 1006 surface.

In one embodiment, a Separation by Implantation of Oxygen (SIMOX) method is used to form the SOI substrate. In this embodiment, (FIG. 13) a substrate 1300 is provided and deep implantation of oxygen ions (typically high dose) is performed into the substrate 1300 to form the SOI substrate. The substrate 1300 is annealed to complete the formation of the SOI substrate. A buried oxide layer 1302 will be formed within the substrate 1300. In one embodiment, the substrate 1300 is a single crystalline silicon substrate. The tri-gate device will be formed above the silicon portion that is above the buried oxide layer 1302. Thus, the silicon portion that is above the oxide layer 1302 is essentially the device substrate 1006. In one embodiment, the substrate 1300 is formed from an ingot having a reference line created at the <110> crystal plane location such that when spliced from the ingot, the substrate 1300 has a reference notch created at a <110> crystal plane location. When placed on a processing tool, the notch is offset by 45 degrees or –45 degrees with respect to an alignment point on the processing tool. Thus, instead of processing the substrate 1300 where the notch is aligned as conventionally would (e.g., aligned to a designated location on the processing tool designated for the notch), the substrate 1300 is rotated so that the notch is offset during processing. Offsetting the notch will provide the tri-gate with a <100> crystal planes in all sides of the gate as previously discussed. In alternative embodiments, the substrate 1300 can be created from an ingot 1400 (FIG. 14A) wherein a reference line is located at a <100> crystal plane location. When the ingot 1400 is spliced into wafers to create the substrate 1300, a notch 1404 will be created at a <100> crystal plane location. The substrate 1300 with the <100> notch can be processed using the SIMOX method previously discussed. A tri-gate device can be formed in the substrate 1300 without the need to rotate the substrate 1300 by 45 degrees or −45 degrees to create the tri-gate with all sides having the <100> crystal plane structure.

Figure 13:
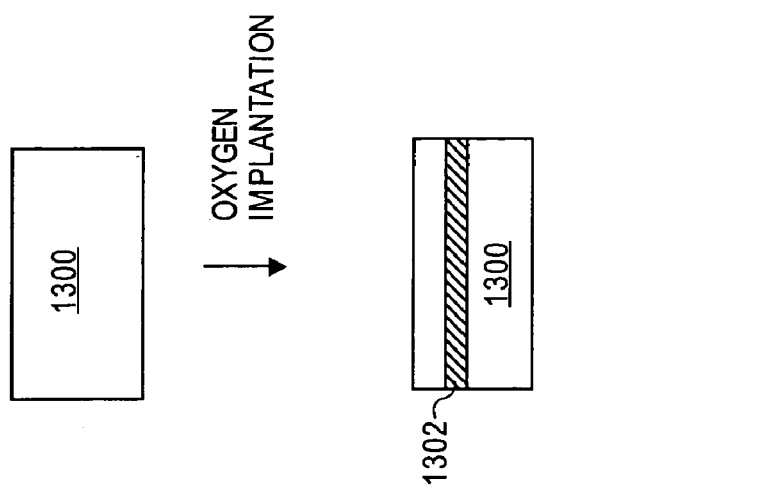
FIGS. 11–13 illustrate exemplary methods of forming a high mobility silicon substrate for a tri-gate device in accordance to an embodiment of the present invention.
Figure 12:
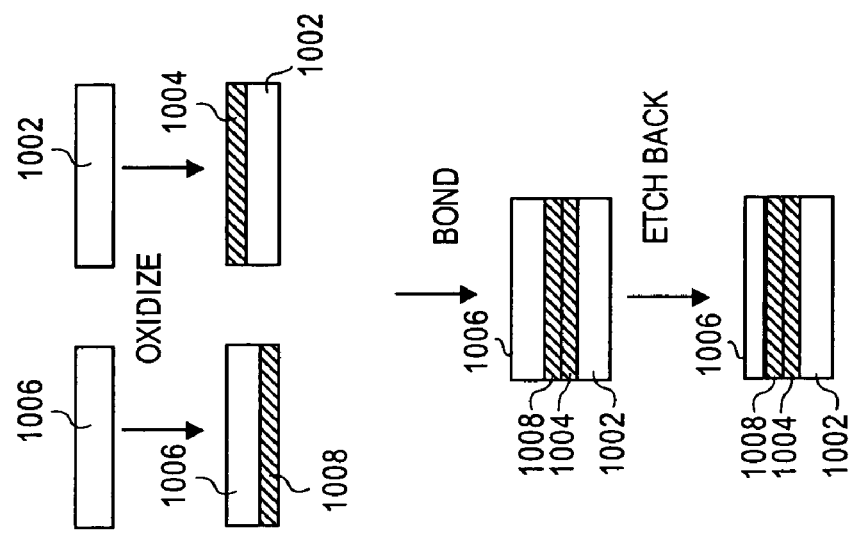
Figure 11:
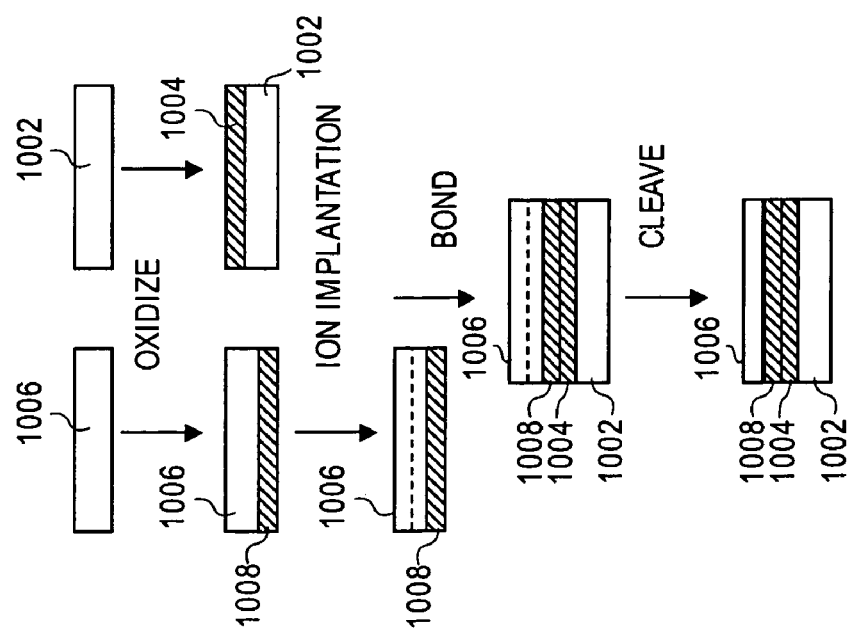

In other embodiments, instead of rotating the device substrate 1006 relative to the substrate 1002 as illustrated in FIGS. 11–12 or realigning the device substrate 1300 as discussed in FIG. 13, the device substrate for the non-planar device can be made so that the notch is relocated. The notch for the wafer used to form the device substrate thus is relocated to a <100> crystal plane location. When the device substrate has to be rotated, the mechanical rotation will dictate the reliability, accuracy, and/or repeatability of the rotation of the device substrate. For example, when the substrate 1006 and the substrate 1002 are offset to each other by 45 degrees or −45 degrees with respect to offsetting the notch on each wafer, the accuracy of the offset may be affected by the accuracy of the wafer bonding process or equipment. Thus, the mechanical rotation of the substrate 1006 with respect to the substrate 1002 may dictate the degrees of the offset (for example, by a few degrees). To minimize the potential for misalignment, the device substrate 1006 or the substrate 1300 can be created with the notch at the <100> crystal plane location (as opposed to the <100> location). As illustrated in FIG. 14A, an ingot 1400 that is used to later form the device substrate 1006 or the substrate 1300 can be formed with a reference line 1402 created at a <100> crystal plane location using X-Ray Diffraction, which has a much more accurate mechanical rotation than that of the wafer bonding process. When the ingot 1400 is spliced to generate a plurality of wafers 1406, which can be used to form substrates 1006 or 1300, each wafer 1406 will have a notch 1404 located at a <100> crystal plane location.

Figure 14B:
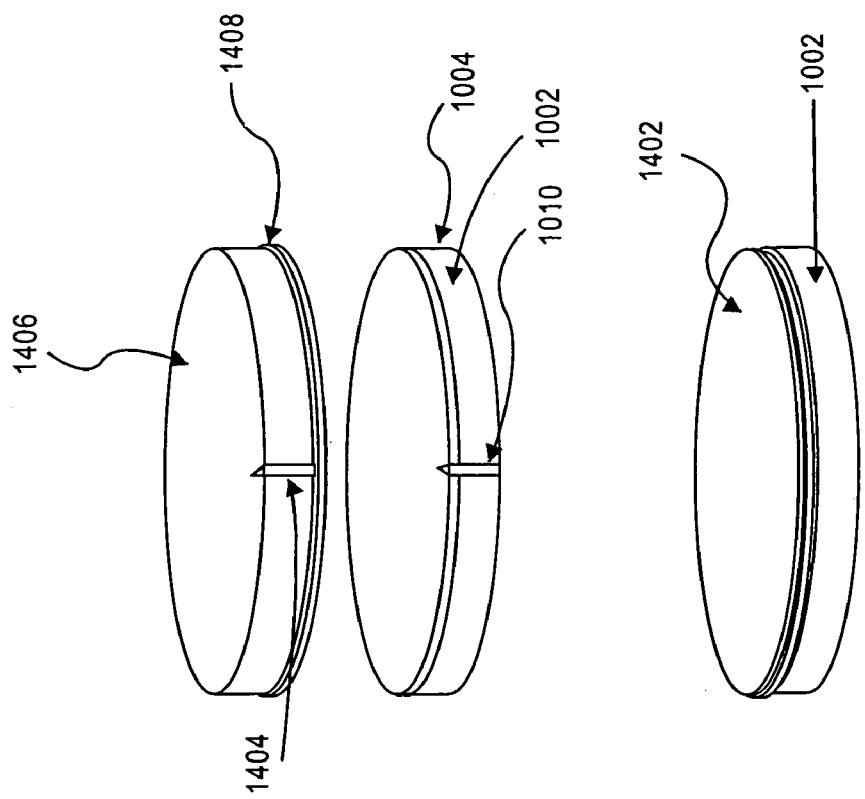
FIG. 14B illustrates the bonding of a wafer having a <100> reference notch to a wafer having a <110> reference notch.
Figure 14A:
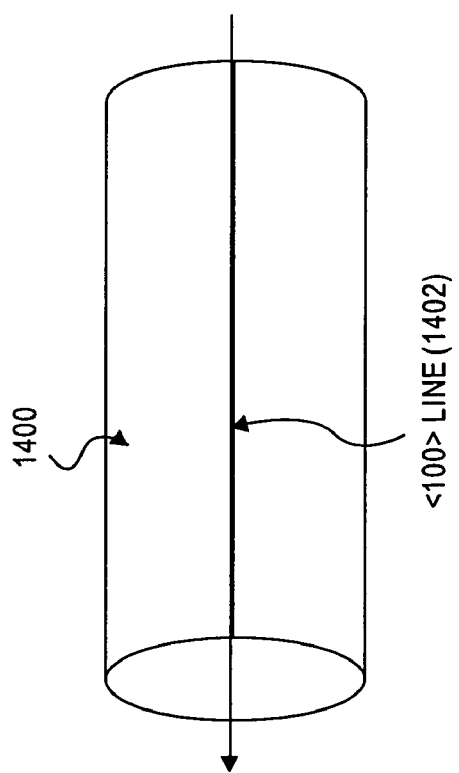
FIG. 14A illustrates an exemplary silicon ingot with a <100> reference notch.

In FIG. 14B, the wafer 1406 is bonded to another wafer, the substrate 1002, in one embodiment, to create the SOI substrate. The wafer 1404 may include insulating layer 1408 and the substrate 1002 may include the insulating layer 1004 as previously discussed. As before, the substrate 1002 includes a notch 1010 created at the <110> crystal plane location as previously discussed. The wafer 1406, however, has the notch 1404 located at the <100> crystal plane location. The notches 1404 and 1010 are aligned over each other during processing as shown in FIG. 14B. There is no need to rotate the wafer 1406 to realign the crystal structure of the wafer 1406 during processing. The wafer 1406 will have the 45 degrees or −45 degrees offset due to the relocation of the notch 1404 to the <100> crystal plane location to realign the crystal plane structure in the wafer 1404. The relocation of the notch 1404 to the <100> crystal plane allow the non-planar device formed in the wafer 1406 to have all sides having the <100> crystal plane desirable for high mobility.

Figure 15A:
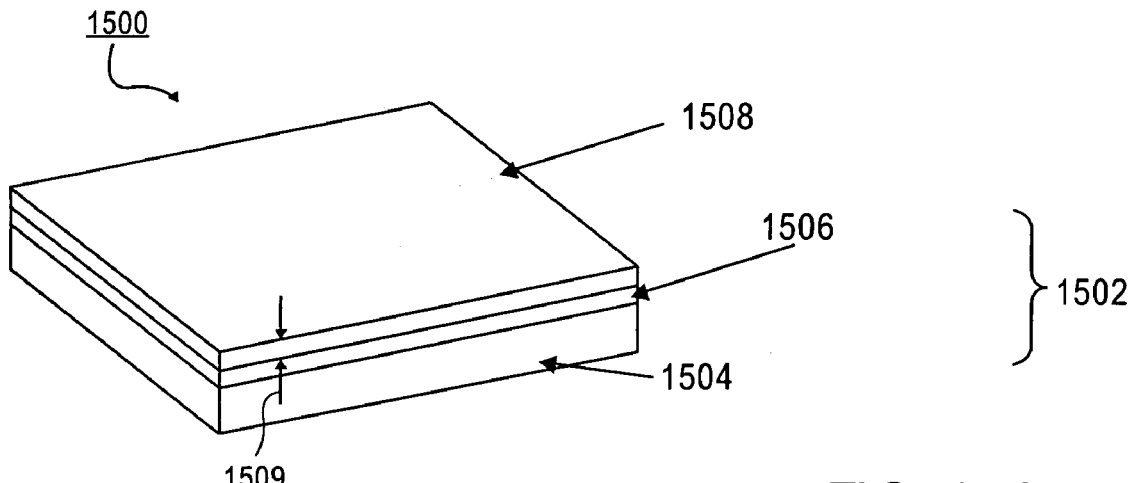
Figure 15B:
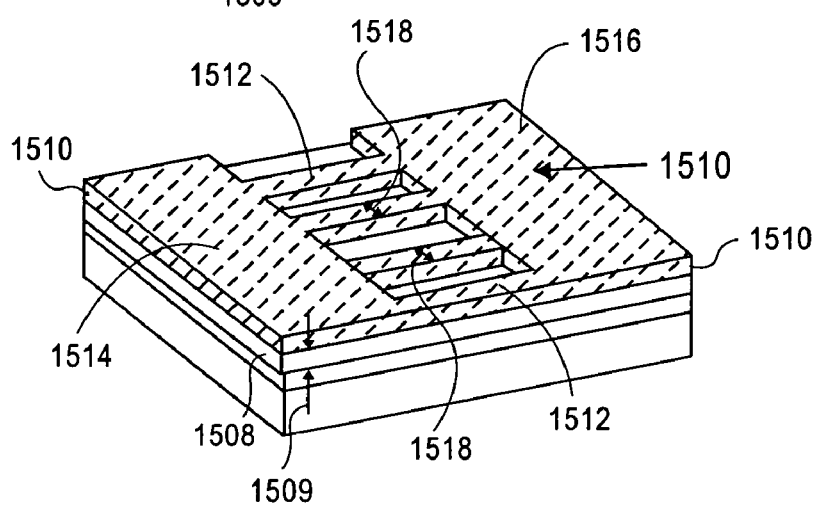
Figure 15C:
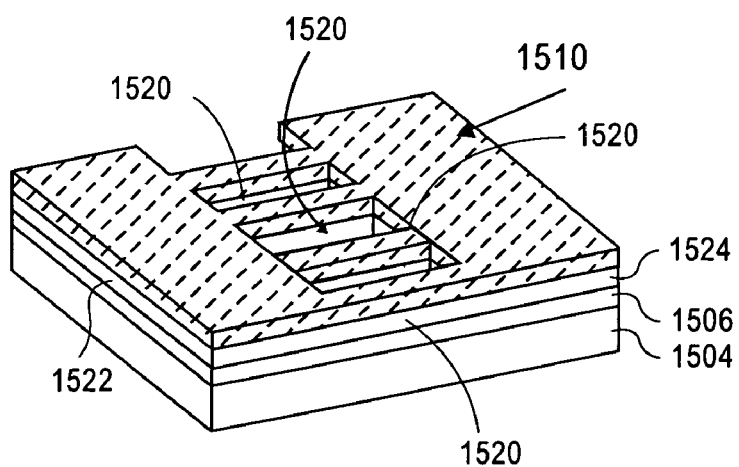
Figure 15D:
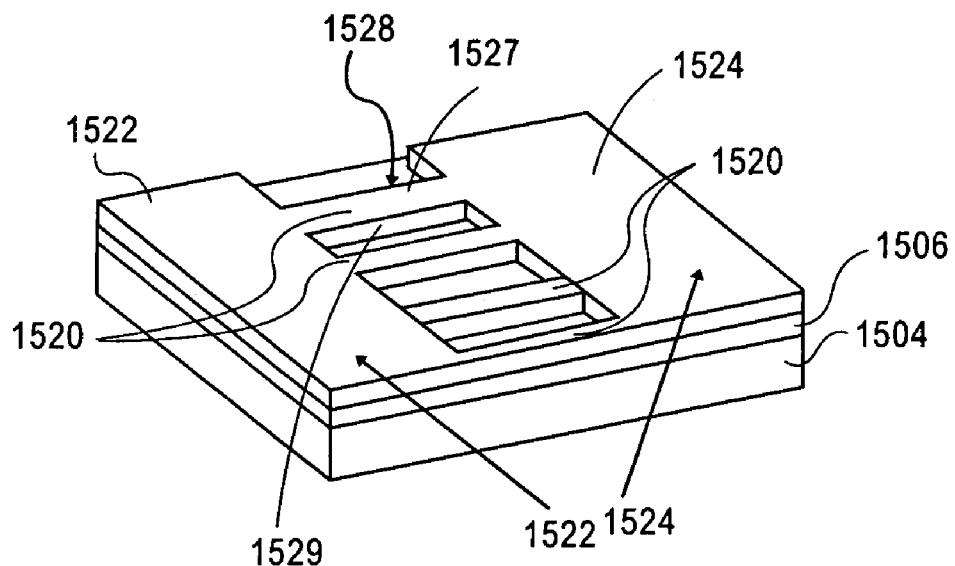
Figure 15E:
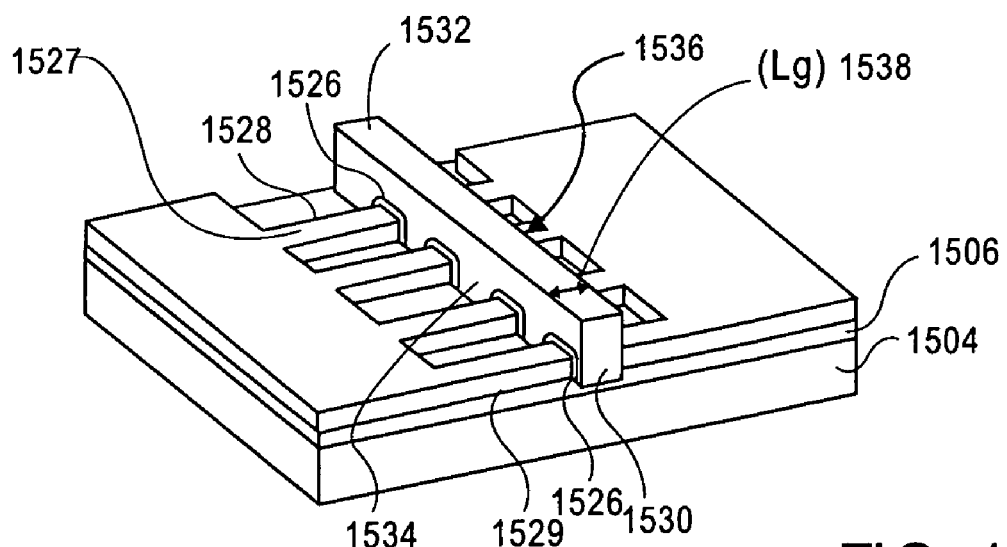
Figure 15F:
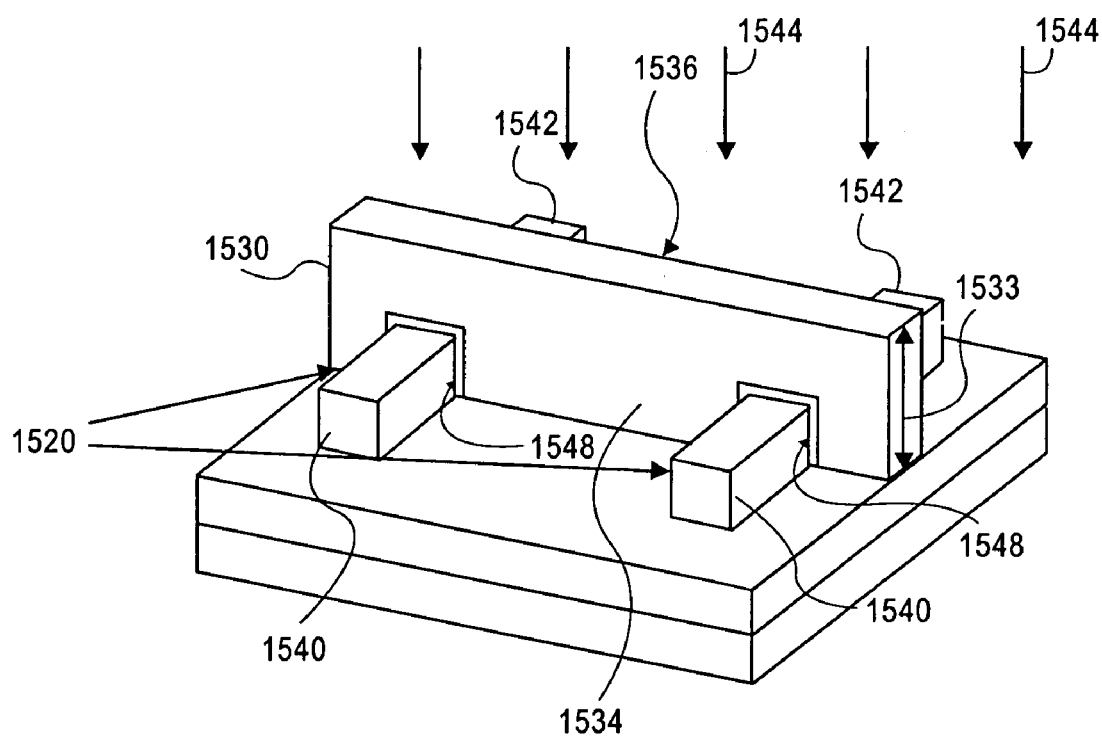
Figure 15G:
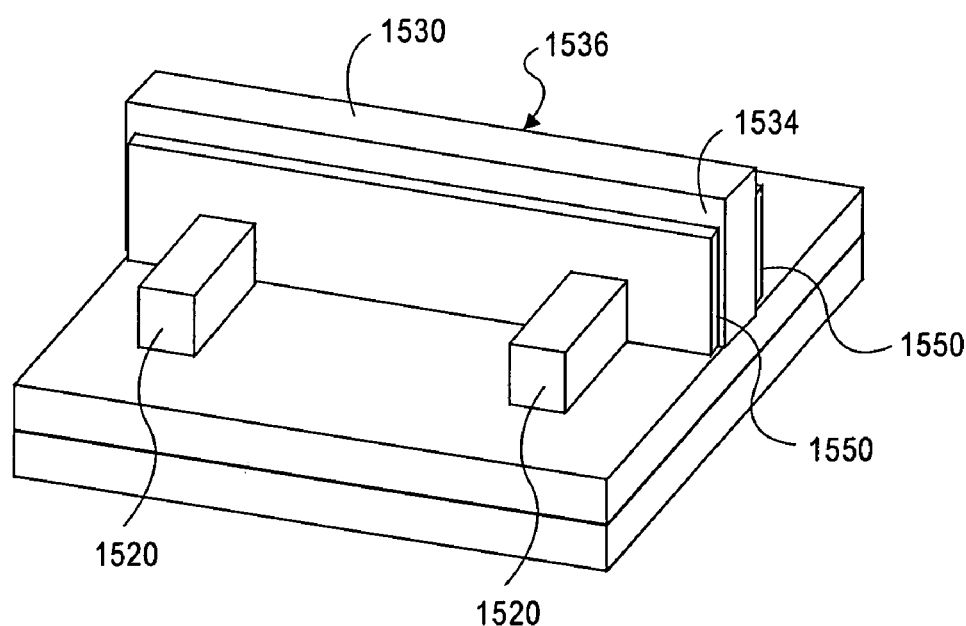
Figure 15J:
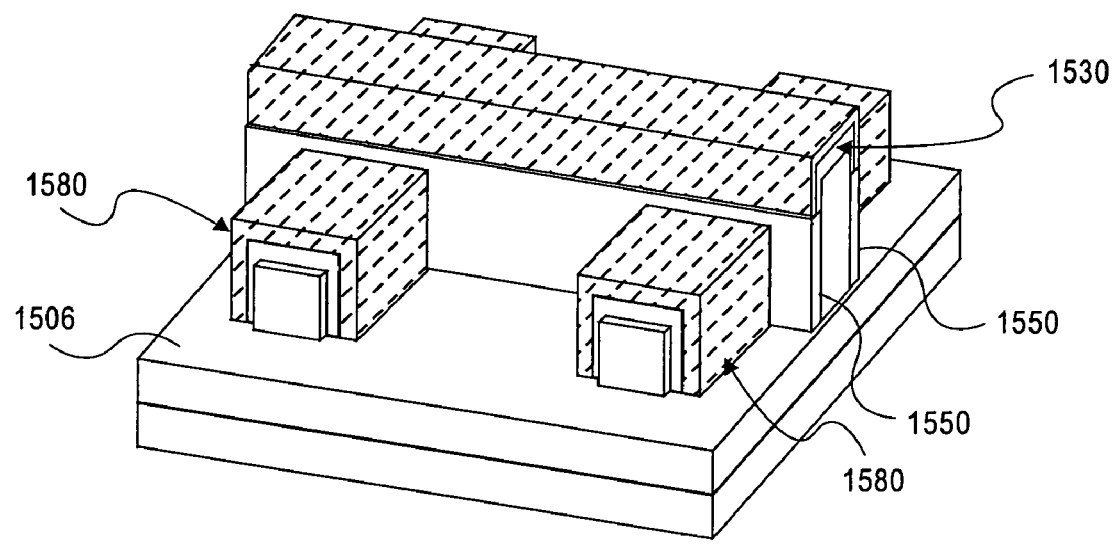

FIGS. 15A–15J illustrate an exemplary method of making a non-planar device or devices 1500 (e.g., tri-gate transistors) in accordance with embodiments of the present invention. In FIG. 15A, a substrate 1502 is provided. The substrate 1502 includes a semiconductor substrate 1504 (e.g., bulk silicon) and an insulating film 1506 (e.g., silicon dioxide). Upon the insulating film 1506, a device semiconductor substrate 1508 (e.g., monocrystalline silicon) is formed. Together, the substrate 1502 and the device substrate 1508 are referred to as the SOI substrate previously described. The device substrate 1508, in one embodiment, has a notch (not shown) created at a <100> crystal plane location and the substrate 1502 has a notch (not shown) created at a <110> crystal plane location. The notches are aligned over each other as previously discussed. In an alternative embodiment, the device substrate 1508 and the substrate 1502 both have a notch created at the <110> crystal plane location. When bonded together to form the SOI substrate, the device substrate 1508 is rotated by 45 degree (or −45 degrees) so that the notches are offset to each other as previously discussed. Isolation regions (not shown) can be formed into the device substrate 1508 in order to isolate the various transistors to be formed therein from one another. Isolation regions can be formed by etching away portions of the device substrate 1508 surrounding a tri-gate transistor, by for example well-known photolithographic and etching techniques, and then back filling the etched regions with an insulating film, such as $SiO_2$.

Next, a photoresist mask 1510 is formed on the device substrate 1508 as shown in FIG. 5B. The photoresist mask 1510 contains a pattern or plurality of patterns 1512 defining locations where semiconductor bodies or fins 1520 for the devices 1500 will be subsequently formed. The photoresist pattern 1512 defines the width 1518 desired of the subsequently formed semiconductor bodies 1520. In an embodiment of the present invention, the pattern 1512 define bodies 1520 having a width 1518 which is equal to or greater than the width desired of the gate length (Lg) of the fabricated transistor. In this way, the most stringent photolithography constraints used to fabricate the transistor are associated with the gate electrode patterning and not the semiconductor body or fin definition. In an embodiment of the present invention, the bodies 1520 will have a width 1518 less than or equal to 30 nanometers and ideally less than or equal to 20 nanometers. In an embodiment of the present invention, the patterns 1512 for the bodies 1520 have a width 1518 approximately equal to the silicon body height 1509. In an embodiment of the present invention, the photoresist patterns 1512 have a width 1518 which is between ½ the semiconductor body height 1509 and two times the semiconductor body height 1509.

The photoresist mask 1510 can also include patterns 1514 and 1516 for defining locations where source landing pads 1522 and drain landing pads 1524 are to be formed. The landing pads can be used to connect together the various source regions and to connect together the various drain regions of the fabricated transistor. The photoresist mask 1510 can be formed by well-known photolithographic techniques including masking, exposing, and developing a blanket deposited photoresist film.

Next, the device substrate 1508 is etched in alignment with photoresist mask 1510 to form one or more silicon bodies or fins and source and drain landing pads (if desired) as shown in FIG. 5C. The substrate 1508 is etched until the underlying buried oxide layer 1506 is exposed. Well-known semiconductor etching techniques, such as anisotropic plasma etching or reactive ion etching can be used to etch the substrate 1508.

Next, the photoresist mask 1510 is removed by well-known techniques, such as by chemical stripping and $O_2$ ashing, to produce the substrate shown in FIG. 5D.

Next, a gate dielectric layer 1526 is formed on and around each semiconductor body 1520. A gate dielectric layer 1526 is formed on the top surface 1527 as well as on the laterally opposite sidewalls 1528 and 1529 of each of the semiconductor bodies 1520. The gate dielectric can be a deposited dielectric or a grown dielectric. In an embodiment of the present invention, the gate dielectric layer 1526 is a silicon dioxide dielectric film grown with a dry/wet oxidation process. In an embodiment of the present invention, the silicon oxide film is grown to a thickness of between 5–15 Å. In an embodiment of the present invention, the gate dielectric film 1526 is a deposited dielectric, such as but not limited to a high dielectric constant film, such as metal oxide dielectric, such as tantalum pentaoxide ($Ta_2O_5$) and titanium oxide ($TiO_2$) or other high-K dielectrics, such as PZT. A high dielectric constant film can be formed by any well-known technique, such as by chemical vapor deposition (CVD).

Next, as shown in FIG. 5E, a gate electrode 1530 is formed. The gate electrode 1530 is formed on the gate dielectric layer 1526 formed on the top surface 1527 and on or adjacent to the sidewalls 1528 and 1529 of each of the semiconductor bodies 1520. The gate electrode 1530 has a top surface 1532 opposite of bottom surface formed on the insulating substrate 1502 and has a pair of laterally opposite sidewalls 1534 and 1536. The distance between the laterally opposite sidewalls 1534 and 1536 define the gate length (Lg) 1538 of the tri-gate transistor. The gate electrode 1530 can be formed by blanket depositing a suitable gate electrode material over the substrate shown in FIG. 5D. The gate electrode can be formed to a thickness 1533 (FIG. 5F) between 200–9000 Å. In an embodiment, the gate electrode has a thickness or height 1533 of at least three times the height 1509 of semiconductor bodies 1520. The gate electrode material is then patterned with well-known photolithography and etching techniques to form the gate electrode 1530 from the gate electrode material. The gate electrode material may comprise polycrystalline silicon, polycrystalline silicon germanium alloy, and metal, such as tungsten, tantalum, and their nitrides. In an embodiment of the present invention, the gate electrode 1530 has the gate length 1538 of less than or equal to 30 nanometers and ideally less than or equal to 20 nanometers.

Next, source 1540 and drain 1542 regions for the transistor are formed in semiconductor body 1520 on opposite sides of the gate electrode 1530. In an embodiment of the present invention, the source 1540 and drain 1542 regions include tip or source/drain extension regions. The source and drain regions and extensions can be formed by placing dopants 1544 into semiconductor bodies 1520 on both sides 1534 and 1536 of gate electrode 1530. If source and drain landing pads are utilized, they may be doped at this time also. For a PMOS tri-gate transistor, the semiconductor fins or bodies 1520 are doped to a p type conductivity and to a concentration between $1\times10^{20}$–$1\times10^{21}$ atoms/cm$^3$. For a NMOS tri-gate transistor, the semiconductor fins or bodies 1520 is doped with n type conductivity ions to a concentration between $1\times10^{20}$–$1\times10^{21}$ atoms/cm$^3$. In an embodiment of the present invention, the silicon films are doped by ion-implantation. In an embodiment of the present invention, the ion-implantation occurs in a vertical direction as shown in FIG. 5F. When the gate electrode 1530 is a polysilicon gate electrode, it can be doped during the ion-implantation process. The gate electrode 1530 acts as a mask to prevent the ion-implantation step from doping the channel region(s) 1548 of the tri-gate transistor. The channel region 1548 is the portion of the silicon body 1520 located beneath or surrounded by the gate electrode 1530. If the gate electrode 1530 is a metal electrode, a dielectric hard mask maybe used to block the doping during the ion-implantation process. In other embodiments, other methods, such as solid source diffusion, may be used to dope the semiconductor body to form source and drain extensions.

Next, if desired, the substrate shown in FIG. 5F can be further processed to form additional features, such as heavily doped source/drain contact regions, deposited silicon on the source and drain regions as well as the gate electrode, and the formation of silicide on the source/drain contact regions as well as on the gate electrode. For examples, dielectric sidewall spacers 1550 (FIG. 5G) can be formed on the sidewalls of the gate electrode 1530; semiconductor films 1560 and 1562 (FIG. 5H) can be formed on the exposed surfaces of the body 1520 for certain applications (e.g., for forming raised source and drain regions); additional doping can be performed (e.g., to form the raised source and drain regions) (FIG. 5I); and a refractory metal silicide 1580 can be formed on the source and drain regions and/or on the gate electrode 1530 (FIG. 5J). Techniques for forming these components are known in the art.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

The invention claimed is:

1. A high mobility semiconductor substrate comprising:
    a first substrate having a first reference orientation located at a <110> crystal plane location on the first substrate; and
    a second substrate formed on top of the first substrate, the second substrate having a second reference orientation located at a <110> crystal plane location on the second substrate,
    wherein the second substrate is formed over the first substrate with the second reference orientation being offset to the first reference orientation by about 45 degrees.

2. The high mobility semiconductor substrate of claim 1 further comprising:
    an insulating layer disposed between the first substrate and the second substrate.

3. The high mobility semiconductor substrate of claim 1 wherein each of the first reference orientation and the second reference orientation includes a notch formed into each of the first substrate and the second substrate, respectively.

4. The high mobility semiconductor substrate of claim 1 wherein the first substrate further comprises a first insulating layer and the second substrate comprises a second insulating layer, and wherein the first substrate and the second substrate are bonded to each other at the first and second insulating layer.

5. The high mobility semiconductor substrate of claim 1 wherein the second substrate has a top field having a <100> crystal plane and a plurality of sides fields each having a <100> crystal plane.

6. The high mobility semiconductor substrate of claim 1 wherein the first substrate is made of a material selected from a group consisting of bulk silicon, polycrystalline silicon, lower monocrystalline silicon, and gallium arsenide.

7. The high mobility semiconductor substrate of claim 1 wherein the second substrate is made of a material selected from a group consisting of silicon, germanium, silicon germanium, gallium arsenide, InSb, GaP, GaSb and carbon nanotubes.

8. The high mobility semiconductor assembly of claim 1 further comprising a non-planar device formed in the second substrate, wherein the non-planar device comprises, a semiconductor body having a top surface and laterally opposite sidewalls formed on the first substrate and in the second substrate, wherein each of the top surface and the laterally opposite sidewalls of the semiconductor body has a <100> crystal plane;

a gate dielectric formed on the top surface and on the laterally opposite sidewalls of the semiconductor body; and a gate electrode formed adjacent the gate dielectric formed on the top of surface and on the laterally opposite sidewalls of the semiconductor body.

9. The high mobility semiconductor device of claim 8 further comprising:

a pair of source/drain regions formed in the silicon body on opposite sides of the gate electrode.

* * * * *